US009553258B2

United States Patent
Whig et al.

(10) Patent No.: US 9,553,258 B2
(45) Date of Patent: *Jan. 24, 2017

(54) MAGNETORESISTIVE MEMORY ELEMENT AND METHOD OF FABRICATING SAME

(71) Applicant: Everspin Technologies, Inc., Chandler, AZ (US)

(72) Inventors: Renu Whig, Chandler, AZ (US); Jijun Sun, Chandler, AZ (US); Nicholas Rizzo, Gilbert, AZ (US); Jon Slaughter, Tempe, AZ (US); Dimitri Houssameddine, Gilbert, AZ (US); Frederick Mancoff, Chandler, AZ (US)

(73) Assignee: Everspin Technologies, Inc., Chandler, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/860,657

(22) Filed: Sep. 21, 2015

(65) Prior Publication Data

US 2016/0013401 A1 Jan. 14, 2016

Related U.S. Application Data

(60) Continuation of application No. 14/219,532, filed on Mar. 19, 2014, now Pat. No. 9,159,906, which is a
(Continued)

(51) Int. Cl.
*H01L 21/8234* (2006.01)
*H01L 43/08* (2006.01)
(Continued)

(52) U.S. Cl.
CPC ............ *H01L 43/08* (2013.01); *G11C 11/161* (2013.01); *H01L 43/02* (2013.01); *H01L 43/10* (2013.01); *H01L 43/12* (2013.01)

(58) Field of Classification Search
CPC ..................................................... H01L 43/08
(Continued)

(56) References Cited

U.S. PATENT DOCUMENTS 5,768,181 A 6/1998 Zhu et al.
6,122,150 A 9/2000 Gill
(Continued)

FOREIGN PATENT DOCUMENTS

JP 2000332317 11/2000

OTHER PUBLICATIONS

Extended European Search Report issued in EP application No. 12796925, dated Mar. 23, 2105, 10 pages.
(Continued)

*Primary Examiner* — Ajay K Arora

(57) ABSTRACT

A magnetoresistive memory element (for example, a spin-torque magnetoresistive memory element), includes first and second dielectric layers, wherein at least one of the dielectric layers is a magnetic tunnel junction. The memory element also includes a free magnetic layer having a first surface in contact with the first dielectric layer and a second surface in contact with the second dielectric layer. The free magnetic layer, which is disposed between the first and second dielectric layers, includes (i) a first high-iron interface region located along the first surface of the free magnetic layer, wherein the first high-iron interface region has at least 50% iron by atomic composition, and (ii) a first layer of ferromagnetic material adjacent to the first high-iron interface region, the first high-iron interface region between the first layer of ferromagnetic material and the first surface of the free magnetic layer.

43 Claims, 7 Drawing Sheets

Related U.S. Application Data division of application No. 13/158,171, filed on Jun. 10, 2011, now Pat. No. 8,686,484.

(51) Int. Cl.
 *H01L 43/10* (2006.01)
 *H01L 43/12* (2006.01)
 *H01L 43/02* (2006.01)
 *G11C 11/16* (2006.01)

(58) Field of Classification Search
 USPC .......................................................... 438/238
 See application file for complete search history.

(56) References Cited

U.S. PATENT DOCUMENTS

| | | | |
|---|---|---|---|
| 6,469,926 B1 | 10/2002 | Chen | |
| 6,544,801 B1 | 4/2003 | Slaughter et al. | |
| 6,714,444 B2 | 3/2004 | Huai et al. | |
| 6,750,068 B2 | 6/2004 | Chen | |
| 6,831,312 B2 | 12/2004 | Slaughter et al. | |
| 7,067,331 B2 | 6/2006 | Slaughter et al. | |
| 7,098,495 B2 | 8/2006 | Sun et al. | |
| 7,241,631 B2 | 7/2007 | Huai et al. | |
| 7,382,643 B2 | 6/2008 | Ashida et al. | |
| 7,605,437 B2 | 10/2009 | Mancoff et al. | |
| 8,686,484 B2 | 4/2014 | Whig et al. | |
| 9,159,906 B2 | 10/2015 | Whig et al. | |
| 2004/0091744 A1 | 5/2004 | Carey et al. | |
| 2004/0145850 A1 | 7/2004 | Fukumoto et al. | |
| 2004/0257719 A1 | 12/2004 | Ohba et al. | |
| 2005/0219769 A1 | 10/2005 | Shimura et al. | |
| 2006/0018057 A1 | 1/2006 | Huai | |
| 2006/0098354 A1 | 5/2006 | Parkin | |
| 2006/0114618 A1 | 6/2006 | Hosomi et al. | |
| 2006/0141640 A1 | 6/2006 | Huai et al. | |
| 2006/0221680 A1 | 10/2006 | Hosotani | |
| 2007/0076469 A1 | 4/2007 | Ashida et al. | |
| 2007/0111332 A1 | 5/2007 | Zhao et al. | |
| 2007/0228501 A1 | 10/2007 | Nakamura et al. | |
| 2008/0023740 A1 | 1/2008 | Horng et al. | |
| 2008/0074805 A1 | 3/2008 | Ikarashi et al. | |
| 2008/0179699 A1 | 7/2008 | Horng et al. | |
| 2008/0182342 A1 | 7/2008 | Parkin | |
| 2008/0299679 A1 | 12/2008 | Zhao et al. | |
| 2009/0027810 A1 | 1/2009 | Horng et al. | |
| 2009/0108383 A1 | 4/2009 | Horng et al. | |
| 2010/0148167 A1 | 6/2010 | Whig et al. | |
| 2010/0195380 A1 | 8/2010 | Wang et al. | |
| 2010/0302690 A1 | 12/2010 | Worledge | |
| 2010/0320550 A1 | 12/2010 | Abraham et al. | |

OTHER PUBLICATIONS

Partial Supplementary European Search Report, issued Dec. 2, 2014, in connection with EP Application 12796925.1, 6 pages.

Nakamura et al., "Current-Induced Magnetization Switching in Two Types of Nanopillar with Dual Fixed Layers", Japanese Journal of Applied Physics, vol. 45, No. 5A, pp. 3846-3849.

Fuchs et al., "Adjustable Spin Torque in Magnetic Tunnel Junctions with Two Fixed Layers", App. Physics Letters 85, 2005, pp. 152509-1 to 152509-3.

Berger, L., "Multilayer Configuration for Experiments of Spin Precession Induced by a DC Current", Journal of Applied Physics, vol. 93, No. 10, 2003, pp. 7693-7695.

USPTO, International Searching Authority, International Search Report, mailed Aug. 9, 2012, in connection with PCT/US2012/041354.

100

200

300

400

500

600

700

802

MAGNETORESISTIVE MEMORY ELEMENT AND METHOD OF FABRICATING SAME

CROSS REFERENCE TO RELATED APPLICATIONS

This application is a continuation of U.S. patent application Ser. No. 14/219,532, filed Mar. 19, 2014 (U.S. Pat. No. 9,159,906), which is a divisional of U.S. patent application Ser. No. 13/158,171, filed Jun. 10, 2011 (U.S. Pat. No. 8,686,484).

TECHNICAL FIELD

The exemplary embodiments described herein generally relate to magnetoresistive random access memory (MRAM) and more particularly relate to spin-torque MRAM elements.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The spin angular momentum carried by the spin-polarized tunneling current causes reversal of the free layer, with the final state (parallel or antiparallel) determined by the polarity of the current pulse. Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element. The mean current required to switch the magnetic state of the free layer is called the critical current (Ic). The critical current density (Jc) is the average critical current per area of the bit (Jc=Ic/A), and the current supplied by the circuit to switch spin-torque MRAM elements in a memory array is the write current (Iw). Reducing the write current Iw is desirable so that a smaller access transistor can be used for each bit cell and a higher density, lower cost memory can be produced. Lowering Jc is desirable to prevent tunnel barrier damage during programming.

In order to reduce write current, some spin-torque MRAM elements incorporate a dual-spin-filter structure, in which the MTJ stack includes two different spin-polarizing layers, one on each side of the free layer, to lower Jc by improving spin-torque transfer efficiency through increased spin torque on the free layer, resulting in a lower write current. Some dual-spin-filter devices have two tunnel barriers for providing a lower Jc, and a more symmetrical write current in the current up/down direction, than single tunnel barrier devices.

Dual-spin-filter devices require that the spin-polarizing fixed layers on either side of the free layer have opposite magnetization directions, so that the spin-torque effect from each of the two fixed layers will act together to switch the free layer magnetization into the desired direction when a current flows either up or down through the device. One way to provide such opposed fixed layers is to use a pinned synthetic antiferromagnetic (SAF) Fixed region on one side and a single pinned layer on the opposite side of the free layer. Another known dual-spin-filter device includes a three-layer SAF and a two-layer SAF on opposed sides of the free layer. However, a device having such opposed fixed layers has reduced magnetoresistance ratio (MR) compared to a single-tunnel-barrier device since one tunnel junction is in the parallel state when the other is in the antiparallel state.

The structure will have a different resistance depending on the stable magnetic states in which the free magnetic layer has been written. In order to achieve a magnetic element which includes a better read signal, or an improved MR, a larger difference between the individual resistances, and thus a larger MR, is desirable.

Accordingly, it is desirable to provide a spin-torque magnetoresistive memory element having a low critical current density and a high MR. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A spin-torque magnetoresistive memory element is formed on a substrate having a surface defining a plane. The spin-torque magnetoresistive memory element comprises a first electrode comprising a ferromagnetic material formed over the substrate; a second electrode; a free magnetic layer; a first tunnel barrier positioned between the free magnetic layer and the first electrode to form a first tunnel junction having a first magnetoresistance ratio and a first resistance-area product; and a second tunnel barrier positioned between the free magnetic layer and the second electrode to form a second tunnel junction having a second magnetoresistance ratio and a second resistance-area product, wherein the first magnetoresistance ratio and the first resistance-area product are one of less than half or more than double the second magnetoresistance ratio and the second resistance-area product, respectively.

A method for forming the spin-torque magnetoresistive memory element on a substrate having a surface defining a plane, comprises forming a first electrode comprising a ferromagnetic material over the substrate, forming a first tunnel barrier over the first electrode, forming a free magnetic layer over the first tunnel barrier, thereby forming a first tunnel junction having a first magnetoresistance ratio and a first resistance-area product, forming a second tunnel barrier over the free magnetic layer, and forming a second electrode over the second tunnel barrier, thereby forming a second tunnel junction having a second magnetoresistance ratio and a second resistance-area, wherein the first magnetoresistance ratio and the first resistance-area produce are one of less than half or more than double the second magnetoresistance ratio and the second resistance-area product, respectively.

Another method for forming a spin-torque MRAM element comprising forming a first tunnel barrier; forming a second tunnel barrier; forming a free layer between the first and second tunnel barriers; forming a first electrode on a side of the first tunnel barrier opposed to the free layer, thereby forming a first tunnel junction having a first magnetoresistance ratio and a first resistance-area product; and forming a second electrode on a side of the second tunnel barrier opposed to the free layer. thereby forming a second tunnel junction having a second magnetoresistance ratio and a second resistance-area product, wherein the first magnetoresistance ratio is more than double the second magnetoresistance ratio and the first resistance-area produce is more than double the second resistance-area product.

BRIEF DESCRIPTION OF THE DRAWINGS

The present invention will hereinafter be described in conjunction with the following drawing figures, wherein like numerals denote like elements.

DETAILED DESCRIPTION

Figure 1:
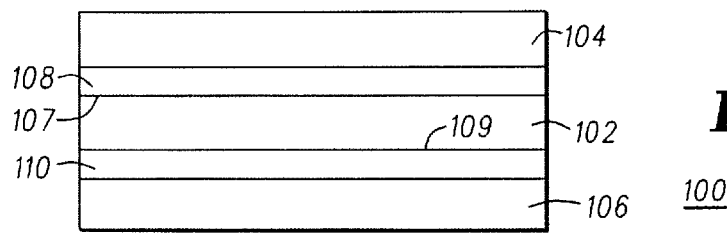
FIG. 1 is a cross section of a spin-torque magnetoresistive memory element in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

In general, what is described herein is a spin-torque magnetoresistive memory device structure with a high magnetoresistance ratio and a low spin-torque critical current density. The structure includes a free layer positioned between first and second electrodes, a first tunnel barrier positioned between the first electrode and the free layer forming a first tunnel junction, and a second tunnel barrier positioned between the second electrode and the free layer forming a second tunnel junction. The tunnel barriers may comprise MgO, for example. One or both of the first and second electrodes may comprise fixed magnetic layers which act as spin polarizers that provide polarized tunneling currents. In a first exemplary embodiment in which the first and second electrodes comprise spin polarizers, the first electrode comprises a ferromagnetic alloy with low Fe content and a high B content compared to the second electrode, and the first tunnel junction has a lower resistance-area product (RA) compared to the second. In a second exemplary embodiment, the free layer includes a high-Fe interface region in contact with the second tunnel barrier. In a third exemplary embodiment, the first electrode is a spin polarizer, the second electrode is a non-ferromagnetic material, and the first tunnel junction has a higher RA compared to the second. The free layer may include an optional high-Fe interface region in contact with the first tunnel barrier and it may include a second high-Fe interface region in contact with the second tunnel barrier. In a fourth exemplary embodiment, the free layer is a compositionally-modulated structure comprising layers of ferromagnetic material, preferably a CoFeB alloy, separated by one or more thinner layers including a non-ferromagnetic transition metal, such as Ta, Nb, V, Zr, or Ru. The non-ferromagnetic transition metal lowers the magnetization of the free layer which thereby allows for thicker layers that typically have better magnetic switching characteristics, and it can be used to tune the exchange coupling for reduced spin-torque critical current. The free layer may comprise multiple alternating layers of CoFeB and thinner layers comprising one or more non-ferromagnetic transition metals.

During the course of this description, like numbers are used to identify like elements according to the different figures that illustrate the various exemplary embodiments.

The spin-torque effect is known to those skilled in the art. Briefly, a current becomes spin-polarized after the electrons pass through the first magnetic layer in a magnetic/non-magnetic/magnetic trilayer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent anti-ferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of the its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel. The MR is defined as $(R_H-R_L)/R_L$, where $R_L$ and $R_H$ are the device resistance in the low and high resistance states, respectively. When the spacer layer is a dielectric tunnel barrier, the tunneling resistance is measured by the resistance-area product (RA), such that the tunneling resistance R of a device having an area $\alpha$, for a tunneling current passing perpendicular to the film plane, is given by $RA/\alpha$. As used herein, the term "film" is the equivalent of a thin layer, and the term "film plane" is a plane to the surface of a film or layer.

FIG. 1 is a side sectional view of an MRAM device 100 configured in accordance with an exemplary embodiment. In practice, an MRAM architecture or device will include many MRAM devices 100, typically organized in a matrix of columns and rows. The exemplary MRAM bit structure (or "stack") 100 generally includes a free magnetic layer (or "free layer") 102 separated from a top electrode 104 and a bottom electrode 106 by tunnel barriers 108 and 110, respectively. Either or both of the tunnel barriers 108 and 110 may be dielectrics, typically oxides such as MgO or AlOx. For the purposes of clarity, some commonly-used layers have not been illustrated in the drawings, including various protective cap layers, seed layers, and the underlying substrate (which may be a conventional semiconductor substrate or any other suitable structure). For the exemplary embodiments described below, the bottom electrode 106 is a ferromagnetic polarizer, while the top electrode 104 may be either a non-ferromagnetic material or a ferromagnetic polarizer. Generally, a ferromagnetic polarizer would include a pinning layer, a pinned magnetic layer, a coupling spacer layer, and a fixed magnetic layer adjacent to the tunnel barrier (none of which are shown) as is well known in the industry.

The three layers including the free layer 102, the tunnel barrier 110 and bottom electrode 106, forms a first magnetic tunnel junction having a MR greater than zero and a first RA. The three layers including the free layer 102, the tunnel barrier 108, and top electrode 104, forms a second magnetic tunnel junction having a MR equal to or greater than zero and a second RA. For the MRAM device 100 to have a good MR, it is desirable to have the second MR less than half the first MR, and the second RA is less than half of the first RA. Most preferably, the second MR is less than one-fourth the first MR, and the second RA is less than one-fourth of the first RA.

The difference in the RA of the two tunnel barriers can be adjusted by either changing the thickness of the tunnel barrier layers 108, 110 or by using different doses of oxidation when forming the dielectrics. The MR for each junction can be adjusted by using thin layers at the tunnel barrier interfaces 107, 109 that are either low polarization or high polarization interfacial layers, as well as through the choice of alloys for the bottom and top electrodes.

Figure 2:
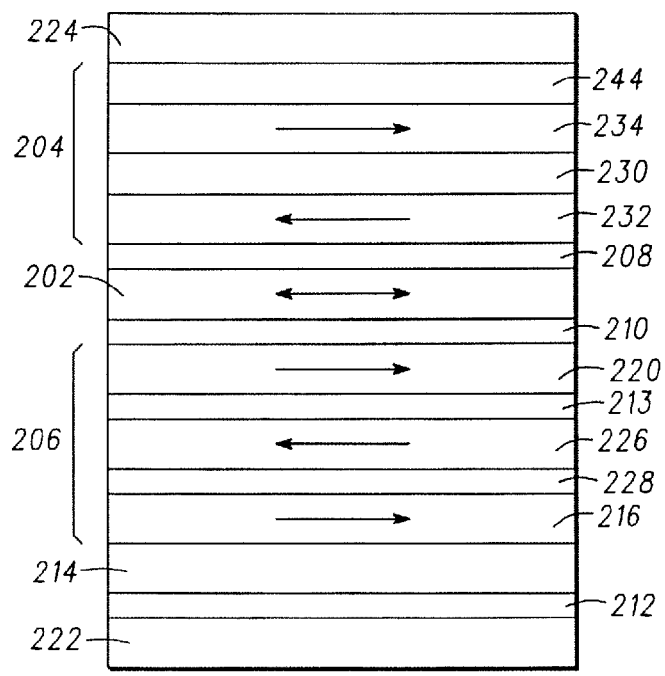
FIG. 2 is a cross section of a spin-torque magnetoresistive memory element in accordance with another exemplary embodiment.

FIG. 2 is a side sectional view of an MRAM device 200 configured in accordance with an exemplary embodiment in which both electrodes are spin polarizers resulting in what may be referred to as a dual spin-filter MTJ. The exemplary dual spin-filter MTJ bit structure (or "stack") 200 generally includes a free magnetic layer (or "free layer") 202 separated from a top electrode 204 and a bottom electrode 206 via tunnel barriers 208 and 210, respectively. Both of the layers 208 and 210 are dielectrics.

Bottom electrode 206 has a fixed magnetization state that does not change when the free layer 202 is switched between its two or more stable states. In the practical embodiment, bottom electrode 206 may include a template or seed layer 212 formed on a conductor 222 for facilitating the formation thereon of a pinning layer 214 made from an antiferromagnetic material, for example, IrMn, PtMn, or FeMn. The template/seed layer 212 is preferably a non magnetic material, for example Ta, TaN, Al, Ru, but can also be a magnetic material, for example NiFe or CoFe. The template/seed layer 212 may include two layers or may be omitted in cases where conductor 222 provides the desired growth characteristics for the subsequent layers. The bottom electrode 206 of device 200 includes three ferromagnetic layers 216, 226, and 220, antiferromagnetically coupled through coupling layers 228 and 213. The pinning layer 214 determines the orientation of a magnetic moment of the pinned ferromagnetic layer 216 formed thereon. Ferromagnetic layer 226 is antiferromagnetically coupled to pinned layer 216, through coupling layer 228, so that their magnetic moments orient antiparallel in the absence of an external field and fixed layer 220 is antiferromagnerically coupled to ferromagnetic layer 226, through coupling layer 213, so their magnetic moments orient antiparallel in the absence of an external field. The ferromagnetic layers 216, 226, and 220 may be formed from any suitable magnetic material, such as at least one of the elements Ni, Fe, Co, or their alloys including alloys incorporating additional elements such as B, C, Ta, V, Zr, and others, as well as so-called half-metallic ferromagnets such as NiMnSb, PtMnSb, $Fe_3O_4$, or $CrO_2$. In one embodiment, for example, pinned magnetic layer 216 and ferromagnetic layer 220 comprises 20-50 Å of CoFe, fixed ferromagnetic layer 220 comprise about 20-30 Å of CoFeB, and free magnetic layer 202 comprises about 20-35 Å of CoFeB. Coupling layers 228 and 213 are formed from any suitable nonmagnetic material, including at least one of the elements Ru, Os, Re, Cr, Rh, Cu, Cr, or their combinations. Such synthetic antiferromagnet structures are known to those skilled in the art and, therefore, their operation will not be described in detail herein. Bottom electrode is chosen to be a SAF with three ferromagnetic layers in device 200 while top electrode 204 is chosen to be a SAF with two ferromagnetic layers so that the magnetization direction of fixed layer 220 and the magnetization direction of top fixed layer 232 will be substantially antiparallel when processed under typical conditions for an MTJ stack as described below.

In this illustration, arrows are used to indicate the direction of the magnetic moment, or magnetization, for individual layers. The magnetization directions of the top and bottom fixed layers 220 and 232 are typically set using a high-temperature anneal in a strong applied magnetic field. During the anneal, the ferromagnetic layers align with the strong magnetic field. When the field anneal is complete, the antiferromagnetic pinning material, such as that used in pinning layer 214, provides an exchange bias to the adjacent ferromagnetic pinned layer in the direction of the applied field.

Top electrode 204 includes a non-magnetic layer ("spacer layer," or "coupling layer") 230 between two ferromagnetic layers 232 and 234. The magnetic moments of ferromagnetic layers 232 and 234 are antiferromagnetically coupled through coupling layer 230, so that their magnetic moments orient antiparallel in the absence of an external field. A top pinning layer 244 can be used to orient the magnetic moment of ferromagnetic layer 234, in the same way that pinning layer 214 orients pinned layer 216. After the field anneal, the top pinned layer 234 and the bottom pinned layer 216 will be biased in the same direction by the pinning material. Since the SAF that forms the bottom electrode has one more ferromagnetic layer than does the top electrode, the magnetization of the bottom fixed layer 220 will be set in a direction antiparallel to the magnetization of the top fixed layer 232, providing the necessary magnetic configuration for additive contributions from both fixed layers to the spin torque transferred to the free layer 202.

Top electrode 204 is a synthetic antiferromagnet (SAF) in that it comprises two ferromagnetic layers separated by a non-magnetic coupling layer, the thickness of the coupling layer chosen to provide strong antiferromagnetic coupling between the two ferromagnetic layers. The useful materials for the layers in top electrode 204 are the same as for bottom electrode 206. In one embodiment, for example, top pinned magnetic layer 234 comprises 20-30 Å of CoFe and ferromagnetic fixed layer 232 comprises about 20-30 Å of CoFeB. It is known in the art, for example, U.S. Pat. No. 7,605,437, that there can be advantages to eliminating the top pinning layer 244 and instead designing electrode 204 to work as an "unpinned" SAF. The magnetic orientation of the unpinned SAF can be set by designing a magnetic asymmetry into the structure, such as a moment imbalance between the ferromagnetic layers of the SAF 232 and 234.

It is desirable for the magnetic moments of fixed layers 220 and 232 to be relatively unaffected by spin-transfer torque from free layer 202, so that only the direction of the free layer 202 changes when a write current is applied. The fixed layers are made stable by the strong coupling between the layers in each SAF structure and the large magnetic volume of the SAFs compared to the free layer 202. The strong exchange coupling to the pinning material contributes additional stability in addition to defining a reference direction.

First and second conductor 222, 224 are formed from any suitable material capable of conducting electricity. For example, conductors 222, 224 may be formed from at least one of the elements Al, Cu, Ta, TaNx, Ti or their combinations. The various ferromagnetic layers may comprise any suitable material having the desired ferromagnetic properties as described above. It is advantageous to have the net magnetic coupling experienced by the free layer to be near zero so that the switching characteristics of the free layer are symmetric. This can be achieved by adjusting the thickness of each ferromagnetic layer in the top and bottom electrodes. There is typically a ferromagnetic coupling between a fixed layer and the free layer, due to various mechanisms known in the art. When both top and bottom fixed layers are present, and oriented in opposite directions as shown in device 200, the ferromagnetic interlayer coupling of one fixed layer opposes that of the other, reducing the net coupling. There is typically antiferromagnetic coupling between the layers in a patterned magnetic structure due to the poles that form at the patterned edges of the layers. Since the magnetization of each layer in a SAF structure is opposite to the nearest other ferromagnetic layer in SAF, they have a cancelling effect on each other. In a bottom electrode comprising a three-layer SAF as shown in device 200, the middle ferromagnetic layer 226 is typically designed to have a higher magnetic moment than ferromagnetic layers 216 and 220 so that the dipolar field created by layer 226 substantially cancels the dipolar fields created by layers 216 and 220. In an optimized structure, the layer thicknesses are adjusted so that all the sources of coupling experienced by the free layer sum to near zero.

In one embodiment, coupling layers 228, 213, 230 comprise Ru having a thickness of approximately 8 Å. In an alternate embodiment, some or all of the coupling layers may comprise a material, such as Ti or Ta, that does not produce any antiparallel coupling between continuous magnetic films, but merely causes exchange decoupling between the magnetic films. In this embodiment, the ferromagnetic SAF layers will be antiferromagnetically coupled due to the magnetostatic dipolar fields generated at the patterned edges of each layer. These alternate coupling layers will be useful for devices patterned to dimensions less than approximately 30 nm because this type of magnetostatic coupling is stronger for smaller patterned shapes.

During fabrication of MRAM structure 200, each succeeding layer (i.e., layers 222, 212, 214, 216, 228, 226, 213, 220, 210, 202, 208, 232, 230, 234, 244, 224) is deposited or otherwise formed in sequence and each MRAM bit may be defined by selective deposition, photolithography processing, and etching in accordance with any of the various conventional techniques known in the semiconductor industry. During deposition of the various fixed and free magnet layers, a magnetic field may be provided to set a preferred easy magnetic axis of the layer (i.e., via induced anisotropy). Similarly, a strong magnetic field applied during the post-deposition high-temperature anneal step may be used to induce a preferred easy axis and a preferred pinning direction for any antiferromagnetically pinned materials.

Free magnetic layer 202 is formed from a ferromagnetic material having two or more stable magnetic states. For example, free magnetic element 202 may be formed of various ferromagnetic alloys comprising at least one of the elements Ni, Fe, and Co. Additional elements are added to the alloys to provide improved magnetic, electrical, or microstructural properties. As with conventional MRAM devices, the direction of the magnetization of free magnetic element 202 determines the resistance of the element. In practice, for a two-state device, the direction of the magnetization of free magnetic element 202 is either parallel or anti-parallel to the magnetization of a fixed magnetic layer, resulting in a low or high resistance representing a "0" bit state or a "1" bit state. Furthermore, the free magnetic element 202 may have an in-plane magnetization while the ferromagnetic spin polarizer has out-of-plane magnetization.

Free magnetic layer 202 has a magnetic easy axis that defines a natural or "default" axis of its magnetization. When MRAM device 200 is in a steady state condition with no current applied from conductor 222 to conductor 224, the magnetization of free magnetic element 202 will naturally point along its easy axis. MRAM device 200 is suitably configured to establish a particular easy axis direction for free magnetic element 202. From the perspective of FIG. 2, the easy axis of free magnetic element 202 points either to the right or to the left. In practice, MRAM device 200 utilizes anisotropy, such as shape, crystalline, or interface anisotropy, in the free magnetic layer 202 to achieve the orientation of the respective easy axes. It is understood by those skilled in the art that some materials have a strong perpendicular anisotropy which can be used to make free layers with the two magnetic states lying along a perpendicular easy axis so the two magnetic states are up and down in FIG. 2. For such devices, one or more perpendicular fixed layer is also used.

In addition to carrying the write current, conductors 222 and 224 also serve as the data read conductors for MRAM device 200. In this regard, data in MRAM device 200 can be read in accordance with conventional techniques: a small current flows through MRAM device 200 and electrode 224, and that current is measured to determine whether the resistance of MRAM device 200 is relatively high or relatively low. The read current is much smaller than the current required to switch the free layer by spin-torque in order to avoid disturbs caused by reading the cell.

In practice, MRAM device 200 may employ alternative and/or additional elements, and one or more of the elements depicted in FIG. 2 may be realized as a composite structure or combination of sub-elements. The specific arrangement of layers shown in FIG. 2 merely represents one suitable embodiment of the invention.

In order to determine a change in state of a magnetic element, a magnetoresistance must be sufficiently high. Three exemplary embodiments are described herein for providing this high magnetoresistance along with a low critical current density (Jc). For a structure with two tunnel junctions, the MR is maximized when one junction dominates the resistance change by having a much larger resistance change than the other junction when the free layer changes state. This is best accomplished by having a dominant junction with both a larger MR and a larger RA than the other junction.

In the present invention, high MR of the dominant tunnel junction is accomplished by using higher Fe content at the tunnel-barrier interfaces of the dominant junction as compared to the other junction. To make the tunnel junction formed by layers 208, 202, and 232 (FIG. 2) the high-MR junction, the surfaces in contact with tunnel barrier 208, which are the surfaces of the adjacent ferromagnetic layers 202 and 232, should comprise a higher Fe content than the surfaces in contact with tunnel barrier 210. In accordance with one exemplary embodiment, it is preferred that fixed layer 220, which is the fixed ferromagnetic layer adjacent to tunnel barrier 210, have a low Fe content of less than 20% by atomic composition and a B content greater than 20% by atomic composition, and more preferably a low Fe content of approximately 5% and a B content of approximately 25% by atomic composition. The fixed layer 232, adjacent to tunnel barrier 208 may have an Fe content greater than 20% by atomic composition and a B content of between 14% and 20% by atomic composition.

Figure 3:
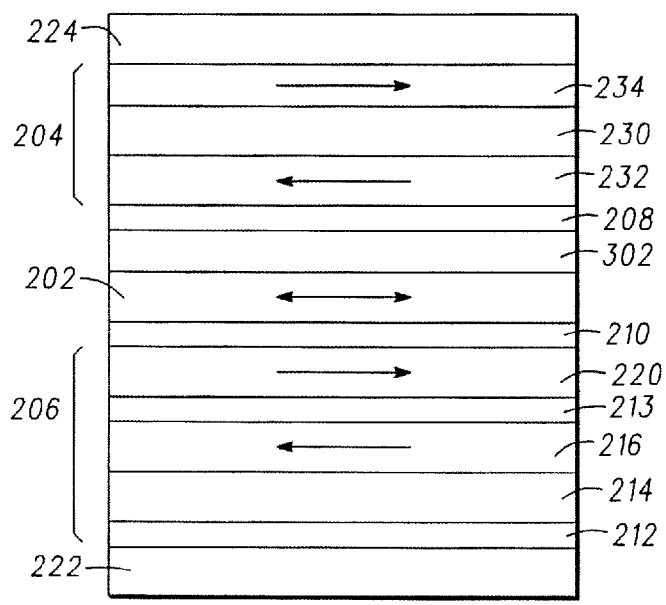
FIG. 3 is a cross section of a spin-torque magnetoresistive memory element in accordance with yet another exemplary embodiment.

Referring to FIG. 3 and in accordance with another exemplary embodiment, the device 300 includes a deposition of a small amount of iron (Fe) between the tunnel barrier 208 and the free magnetic layer 202. The thin Fe interface deposition may form a continuous atomic layer of Fe or may mix with the underlying free ferromagnetic alloy in the final annealed structure, resulting in a high-Fe interface region 302 adjacent to tunnel barrier 208. It should be noted that all components of this exemplary embodiment as illustrated in FIG. 3 that are similar to components of the exemplary embodiment of FIG. 2 are designated with like numbers. The top electrode 204 shown in FIG. 3 as an unpinned SAF as described previously, and the bottom electrode 206 is a pinned SAF with two ferromagnetic layers. The amount of the Fe deposition may be in the range of 0.5 Å to 5 Å, but preferably is in the range of 1.5 Å-3 Å, expressed in equivalent continuous film thickness (see U.S. Pat. No. 7,098,495 assigned to the assignee of the present application regarding high polarization insertion layers). By adding a small amount of pure Fe at the interface between tunnel barrier 208 and the free layer 202, to form high-Fe interface region 302, one can obtain higher MR values even when free layer 202 is predominantly comprised of low-Fe, high-B CoFeB alloy. Whether the high-Fe interface region includes a continuous atomic layer of Fe, a discontinuous layer of Fe, or an interfacial layer of high-Fe alloy, it does result in at least an atomic layer of material at the surface of the free layer composed mainly of Fe atoms. That is, the interface region 302 will be at least 50% Fe by atomic percentage. Adding Fe under tunnel barrier 208 also improves the growth of 208 and increases RA for a given tunnel barrier process. The deposited Fe also improves the growth of the (001) crystallographically-oriented MgO layer upon it. The preferred device design has a low RA and low MR for the tunnel junction formed by tunnel barrier 210 through use of a low-RA tunnel barrier process and low-Fe, high-B alloys for fixed layer 220 and free layer 202, combined with a high RA and high MR for the tunnel junction formed by tunnel barrier 208 by forming a high-Fe interface region 302 below tunnel barrier 208 combined with a high-RA tunnel barrier process. The Fe-rich surface may provide higher perpendicular interface anisotropy energy than for the case where the top tunnel barrier 208 is grown on a free layer, for example, of a CoFeB alloy, without the Fe deposition. The perpendicular interface anisotropy is desirable since it lowers the spin-torque switching critical current Ic by offsetting some of the thin-film demagnetization anisotropy that results in a strong in-plane anisotropy. The interfacial perpendicular anisotropy lowers Ic by making it easier for the free layer moment to precess out of plane as needed in the switching process.

In another aspect of this invention, it has been found that inserting certain materials into the free layer can increase the MR of the top tunnel junction formed by tunnel barrier 208 and sometimes decrease the MR of the bottom tunnel junction formed by tunnel barrier 210.

Figure 4:
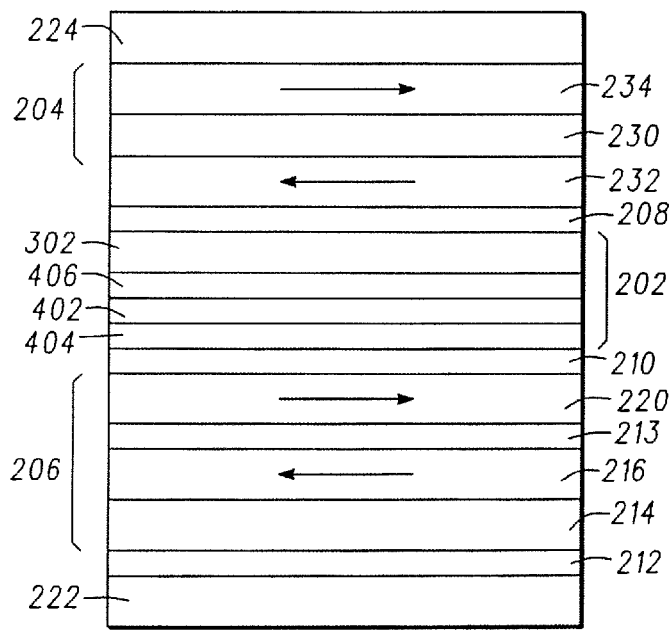
FIG. 4 is a cross section of a spin-torque magnetoresistive memory element in accordance with still another exemplary embodiment

In still another exemplary embodiment is device 400 as shown in FIG. 4, the free layer 202 comprises a thin layer 402 comprising either Ta or Ru positioned between a first portion 404 and a second portion 406. The Ta insertion layer deposition is chosen to be of a thickness that does not form a continuous Ta layer, which would break the exchange between the adjacent layers, but rather mixes with the other free layer materials or forms a layer that is not continuous so that the adjacent ferromagnetic layers 404 and 406 are directly exchange coupled to each other and the entire structure 202 acts as a single ferromagnetic free layer. The typical thickness of Ta deposited to achieve this effect is less than 3.5 Å, and preferably in the range between 1 Å and 3 Å. Other similar materials that form alloys with Co, Fe, or Ni may yield similar results, for example: V, Zr, Ti, Nb, Mo, W, Hf, Mn, or Cr. The Ru insertion layer thickness is chosen to be of a thickness that results in a continuous layer for antiferromagnetic coupling but may have gaps when ferromagnetic coupling is desired, thus being as thin as 2 Angstrom, with little or no alloying with the adjacent ferromagnetic layers 404 and 406. For Ru and similar materials, the ferromagnetic layers 404 and 406 are coupled through this nonmagnetic layer by the well-known oscillatory exchange coupling effect and are considered non-ferromagnetic coupling layers. The coupling strength associated with such non-ferromagnetic coupling layers is controlled by the layer thickness, preferably between 2 Angstrom and 30 Angstrom, and most often between 5 Angstrom and 15 Angstrom. Other similar materials that may yield similar results include: Rh, Os, Cu, Cr, Pd, Pt, or Ir. It should be noted that all components of this exemplary embodiment as illustrated in FIG. 4 that are similar to components of the exemplary embodiment of FIG. 3 are designated with like numbers.

Figure 5:
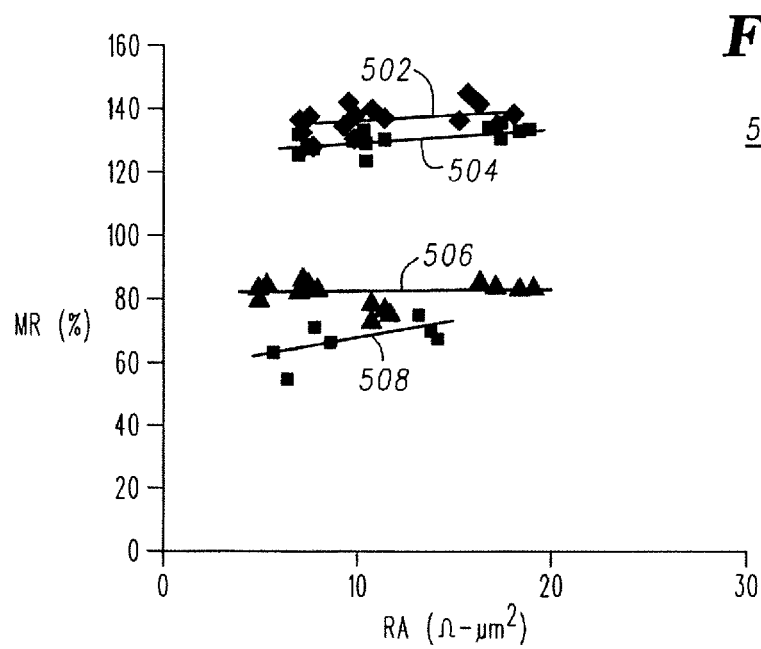
FIG. 5 is a graph of magnetoresistance versus the resistance/area of a top and a bottom tunnel barrier with the free layer comprising Ta, and a top and a bottom tunnel barrier without the Ta insertion in the free layer.

The graph 500 of FIG. 5 shows experimental data of magnetoresistance (MR) versus resistance-area product (RA) for single junctions of a top tunnel barrier 502 with the Ta insertion 402 in the free layer 202 (data 502) compared with a top tunnel barrier without the Ta insertion 402 (data 504), and a bottom tunnel barrier with the Ta insertion 402 in the free layer 202 (data 508) compared with a bottom tunnel barrier without the Ta insertion 402 (data 506). In the case where the top tunnel barrier forms the dominant magnetic tunnel junction of a dual tunnel barrier device, adding the Ta insertion 402 can be expected to increase the MR of the device since it would enhance the MR of the dominant junction and reduce the MR of the other junction. The symbols are measured data points for MTJ stacks made with MgO tunnel barriers and CoFeB ferromagnetic layers having a high-Fe interface region 302 for the top tunnel-barrier stacks. The various RA values were obtained by varying the oxidation dose of the tunnel barrier. Note that, to improve MR in a dual-spin-filter structure, the MR of the bottom junction can be further lowered by using a low-Fe alloy for the bottom fixed layer 220.

Figure 6:
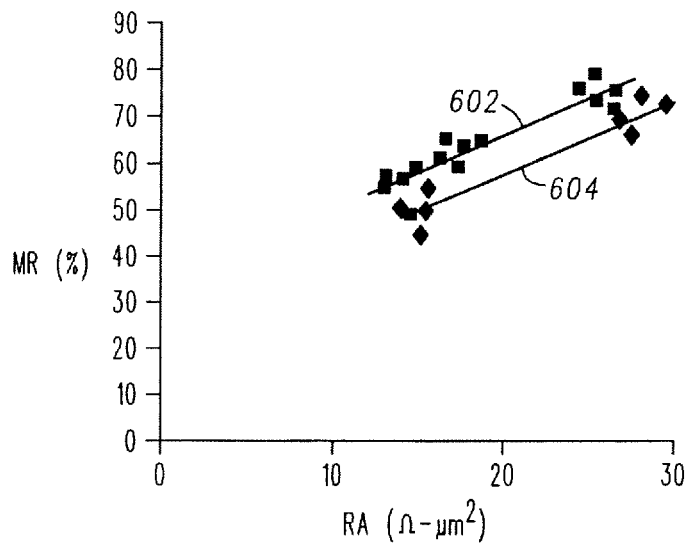
FIG. 6 is a graph of magnetoresistance versus the resistance/area of a dual tunnel harrier device with a Ta insertion within the free layer.

The graph 600 of FIG. 6 shows magnetoresistance (MR) versus RA data for the structure of FIG. 4 with the Ta insertion 402 in the free layer 202 (data 602) compared with the structure of FIG. 3 without the Ta insertion 402 (data 604). It is seen that the Ta insertion 402 provides an improvement in MR averaging approximately 10 percentage points over the resistance-area product range shown.

Figure 7:
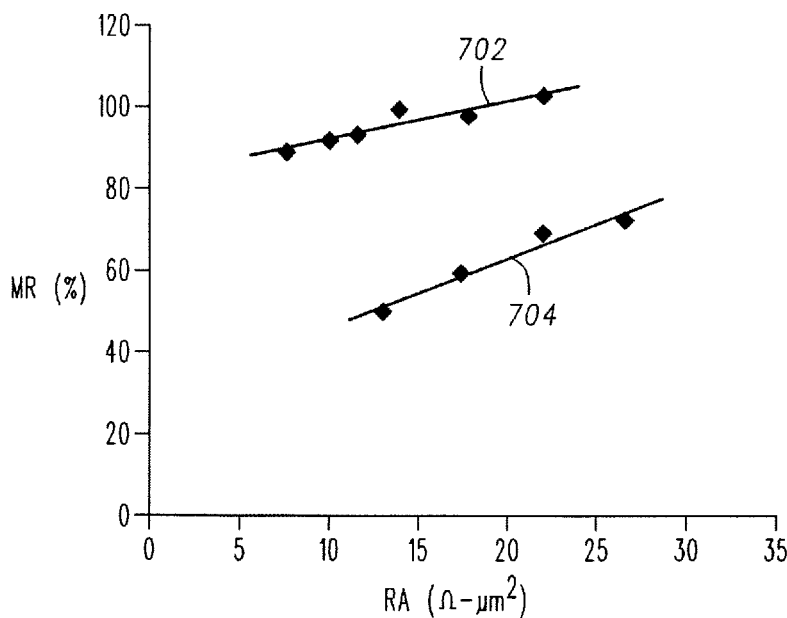
FIG. 7 is a graph of magnetoresistance versus the resistance/area of dual tunnel harrier device with a Ru layer within the free layer.

The graph 700 of FIG. 7 shows magnetoresistance (MR) versus RA for the structure of FIG. 4 with a Ru layer 402 in the free layer 202 (data 702) compared with the same type of data for the structure of FIG. 3 without a Ru layer 402 (data 704), after a field anneal at 300 degrees C. It is seen that the Ru layer 702 provides an improvement in MR of 30 to 50 percentage points over the resistance-area product range shown.

Figure 8:
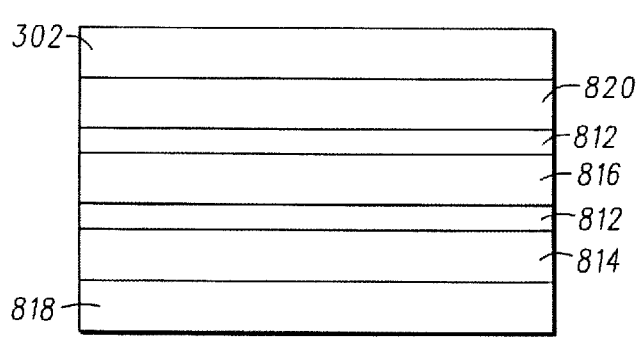
FIG. 8 is a cross section of a spin-torque magnetoresistive memory element in accordance with a further exemplary embodiment.

FIG. 8 is a side sectional view of a free layer 802 configured in accordance with another exemplary embodiment which may be used in lieu of the free layer 202 of FIGS. 2, 3, and 4. Two insertion layers 812 are deposited between ferromagnetic material layers 814, 816, 820, wherein the material used for the insertions and the amount of the material are chosen as described for insertion layer 402 in FIG. 4. Fe is deposited on the top ferromagnetic layer 820 to form high-Fe interface region 302, and an optional high-Fe interface region 818 is formed on the bottom tunnel barrier 210 by depositing Fe on tunnel barrier 210 before depositing ferromagnetic layer 814. Though only two insertion layers are shown, additional such layers could be formed within the free layer 802. In one preferred embodiment, both insertion layers 812 comprise Ta depositions including between 0.5 Å and 3.5 Å of continuous-film-equivalent material, although the layers are not continuous and do not break the exchange coupling between the ferromagnetic layers 814, 816, 820. In the final structure, the regions of Ta deposition 812 are thin films of Ta-rich ferromagnetic alloy or discontinuous regions of Ta lying in the plane between the ferromagnetic materials. The additional Ta reduces the magnetization of the composite free layer material, enabling thicker free layers for a given desired magnetic moment, resulting in better magnetic properties than the thinner layers of the same CoFeB alloy without the Ta insertions. In a second preferred embodiment, one of the insertion layers 812 comprises Ta as described above and another comprises Ru with a thickness chosen as described above for layer 402 of FIG. 4. A Ru insertion layer with an optimized coupling strength can provide reduced switching current (as described in US Patent Publication 2009/0096042) while combining with the desirable reduced magnetization and perpendicular anisotropy provided by the other insertion layer and Fe-rich surface layer described in this invention. Note that ferromagnetic layers 814, 816, and 820 do not need to be the same thickness or material, but can contain different materials and compositions and thicknesses as desired for optimum performance. Ferromagnetic layers 814, 816, and 820 are preferably thin-film depositions of CoFeB alloy with less than 10% Fe and more than 14% B, and most preferably about 5% Fe and 25% B by atomic concentration, each deposition in the thickness range of 5 Å to 20 Å as needed to obtain the desired total magnetic moment for the free layer 802.

As described previously for high-Fe interface region 302 in FIG. 3, the high-Fe interface regions 302 and 818 in FIG. 8 may include a continuous atomic layer of Fe, a discontinuous layer of Fe, or an interfacial layer of high-Fe alloy, resulting in at least an atomic layer of material at the surface of the free layer composed mainly of Fe atoms. That is, the high-Fe interface regions 302 and 818 will be at least 50% Fe by atomic percentage. The Fe-rich interface regions may provide a higher perpendicular interface anisotropy energy than for the case where the top tunnel barrier 208 is grown on a surface without the Fe deposition.

Figure 9:
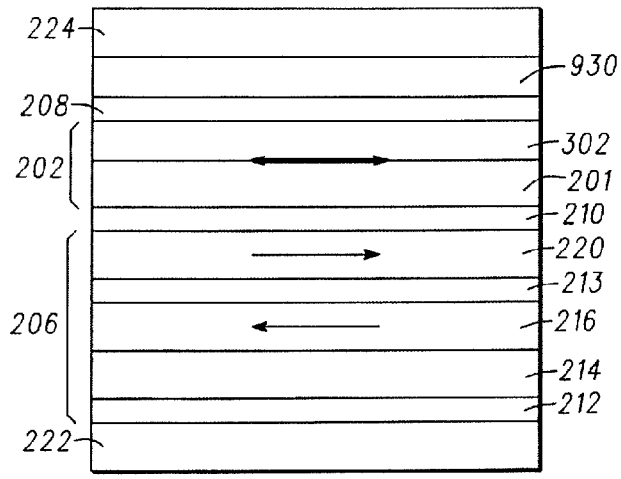
FIG. 9 is a cross section of a spin-torque magnetoresistive memory element in accordance with yet a further exemplary embodiment.

FIG. 9 is a side sectional view of an MRAM device 900 configured in accordance with an exemplary embodiment in which the bottom electrode 206 (FIG. 3) includes a ferromagnetic fixed layer 220 in contact with the bottom tunnel barrier 210 and the top electrode 204 of FIG. 3 is replaced by a non-ferromagnetic material 930. This double-tunnel-barrier structure is not a dual spin filter since it has a ferromagnetic layer polarizing the tunneling electrons on one side only. However, it is found that the top tunnel junction formed by tunnel barrier 208 enables a significant reduction in the critical current Ic required to switch the free layer, even though top electrode 930 is not ferromagnetic. The improvement may arise from magnetic heating of the free layer by the electrons tunneling through tunnel barrier 208 and from perpendicular interface anisotropy resulting from the interface between the surface of the free layer 202 and the top tunnel barrier 208 as described above for device 802 in FIG. 8. Since top electrode 930 is not ferromagnetic, MR for the junction formed by tunnel barrier 208 is zero and this junction will be the non-dominant junction in the double-tunnel-barrier device. For maximum MR of device 900, the resistance of the tunnel junction formed by tunnel barrier 208 should be much less than that of the dominant junction formed by tunnel barrier 210. The RA of barrier 210 should be at least two times higher than RA of barrier 208, and most preferably it should be more than four times higher. The double-barrier structure 900 is useful because it provides many of the benefits of the dual spin filter structures 200, 300, and 400 but with a simpler and thinner top electrode, making the material stack much easier to pattern into devices. However, the choice of materials for the non-ferromagnetic top electrode 930 and the process for making the top tunnel barrier 208 are critical to proper functionality of the devices as described below. A further benefit of double-barrier structure 900 is that the top tunnel junction, having low RA and no magnetoresistance as described above, does not produce a resistance change opposite to the dominant bottom tunnel junction, resulting in a higher MR for the device 900 compared to dual spin filter devices 200, 300, and 400.

The free layer 202 includes a ferromagnetic layer 201 and surface layer 302 in device 900 is most preferably the free layer 802 as shown in FIG. 8 and described above. In the preferred embodiment, the ferromagnetic layers are a CoFeB alloy. Optionally and most preferably, a high-Fe interface region 818 is formed on tunnel barrier 210 by depositing Fe on tunnel barrier 210. Preferably a thin Fe layer is deposited on top of the final ferromagnetic layer to form the high-Fe interface region 302 below the top tunnel barrier 208. Since the tunnel junction formed by tunnel barrier 208 has little or no MR due to the non-ferromagnetic top electrode 930, this Fe deposition does not affect MR as it does for the dual spin filter structures, but has been found to promotes the growth of high quality MgO for tunnel barrier 208 as well as promoting perpendicular magnetic anisotropy at the interface between the free layer 202 and the tunnel barrier 208. The MTJ stack of 900 using the free layer 802 provides all benefits of the free layer 802 and the double tunnel barrier device 900.

It is desirable that the interface between tunnel barrier 208 and the top electrode 930 is of a very high quality so that the tunnel junction formed by tunnel barrier 208 will be free from defects, shorting, and excessive spatial variation of the tunneling current. To form a high quality interface, the choice material for top electrode 930 is important as is the material under tunnel barrier 208. The material in contact with tunnel barrier 208 must have properties that allow for a sharp interface with the tunnel barrier dielectric, typically MgO. Since Fe and Co form such sharp interfaces, those materials and alloys based on those materials can be used for non-ferromagnetic top electrode 930 if they are very thin, preferably less than or equal to 15 Angstrom of deposited ferromagnetic alloy, and a layer of Ta or similar material is deposited on them to suppress their ferromagnetism to the point where the resulting layer is not ferromagnetic within the operating temperature range of the device. Examples of such Fe and Co alloys include Fe, Co, CoFe, and alloys incorporating B, C, Ta, Ti, V, Nb, Zr, W, Hf, Cr, Mo, and Mn. Examples of layers to deposit on these materials to suppress their ferromagnetism include Ta, Ti, V, Nb, Zr, W, Hf, Cr, Ru, Mo, and Mn. Alternatively a non-ferromagnetic material that forms a sharp interface with the dielectric may be deposited on tunnel barrier 208, and may optionally be followed by one of the material combinations described above. The benefit of using a non-ferromagnetic layer first is to eliminate MR and any magnetic coupling to the free layer that would be associated with any residual ferromagnetic material at the interface. The benefit of also including one of the Fe or Co alloys over the non-ferromagnetic layer is to provide an amorphous layer that is very resistant to inter-diffusion between the MTJ stack and materials from the top contact 224. Examples of such top electrodes 930 include: Ru, Ru/Ta, CoFeB (<15 Å)/Ta, and Ru/CoFeB (<15 Å)/Ta.

As described above with regards to device 300 in FIG. 3, free layer 802 in FIG. 8, and device 900 in FIG. 9, an Fe-rich surface at the interface with MgO may provide a higher perpendicular interface anisotropy energy than for the case where the MgO is in contact with a typical CoFeB alloy used for the free layer, without the Fe deposition 302 applied. For MTJ devices having in-plane magnetic easy axes, the perpendicular interface anisotropy lowers the spin-torque switching critical current Ic by offsetting some of the thin-film demagnetization anisotropy that results in a strong in-plane anisotropy. The interfacial perpendicular anisotropy lowers Ic by making it easier for the free layer moment to precess out of plane as needed in the switching process. However, if the interface anisotropy is strong enough, and the moment of a ferromagnetic layer low enough, it is possible for the perpendicular interface anisotropy to overcome the in-plane thin-film demagnetization anisotropy, resulting in a film with a perpendicular easy axis. An additional embodiment of the present invention employs the free layer 802 of FIG. 8 or the free layer 202 of FIG. 4, in a double tunnel barrier structure or dual spin filter structure, designed with strong perpendicular anisotropy and a magnetic moment low enough to have a perpendicular easy axis. In this case, the two stable states of the free layer will be with the magnetization vector pointed perpendicular to the plan up toward tunnel barrier 208 or down toward tunnel barrier 210. Similar layers, with or without an antiferromagnetic pinning layer, can be used to form all or part of the bottom and top electrodes with a perpendicular magnetization.

Figure 10:
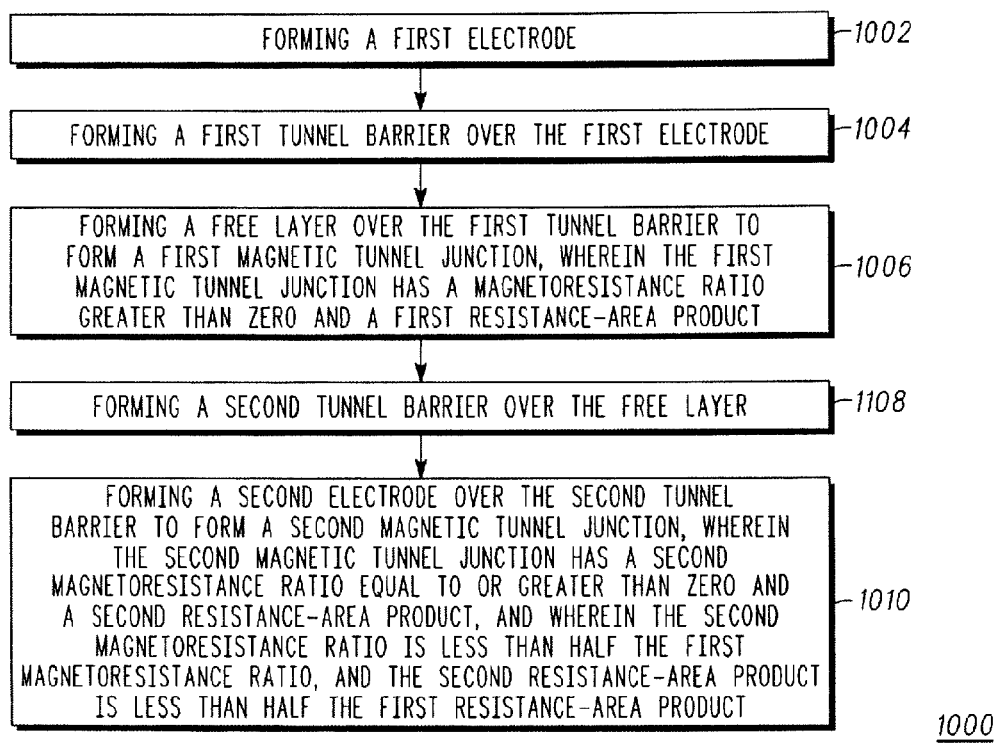
FIG. 10 is a flow chart in accordance with an exemplary embodiment of a process for fabricating a spin-torque magnetoresistive memory element.

FIG. 10 is a flow chart that illustrates an exemplary embodiment of a process 1000 for fabricating an MRAM device having a high magnetoresistance and a low critical current density. It should be appreciated that process 1000 may include any number of additional or alternative tasks, the tasks shown in FIG. 10 need not be performed in the illustrated order, and process 1000 may be incorporated into a more comprehensive procedure or process having additional functionality not described in detail herein. Moreover, one or more of the tasks shown in FIG. 10 could be omitted from an embodiment of the process 1000 as long as the intended overall functionality remains intact.

The method 1000 for forming a spin-torque magnetoresistive element comprises: forming 1002 a first electrode; forming 1004 a first tunnel barrier over the first electrode; forming 1006 a free magnetic layer over the first tunnel barrier to form first magnetic tunnel junction, wherein the first magnetic tunnel junction has a MR greater than zero and a first RA, forming 1008 a second tunnel barrier over the free layer, and forming 1010 a second electrode over the second tunnel barrier to form a second magnetic tunnel junction, wherein the second magnetic tunnel junction has a second MR equal to or greater than zero and a second RA, and wherein the second MR is less than half the first MR, and the second RA is less than half the first RA. Forming the layers typically involves thin-film deposition processes known in the art, including but not limited to physical vapor deposition techniques such as ion beam sputtering and magnetron sputtering. Forming thin insulating layers, such as the tunnel barrier layers, may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment. Devices are typically defined by photolithography and etching steps known in the fields of integrated circuit manufacturing and magnetoresistive sensor manufacturing.

Figure 11:
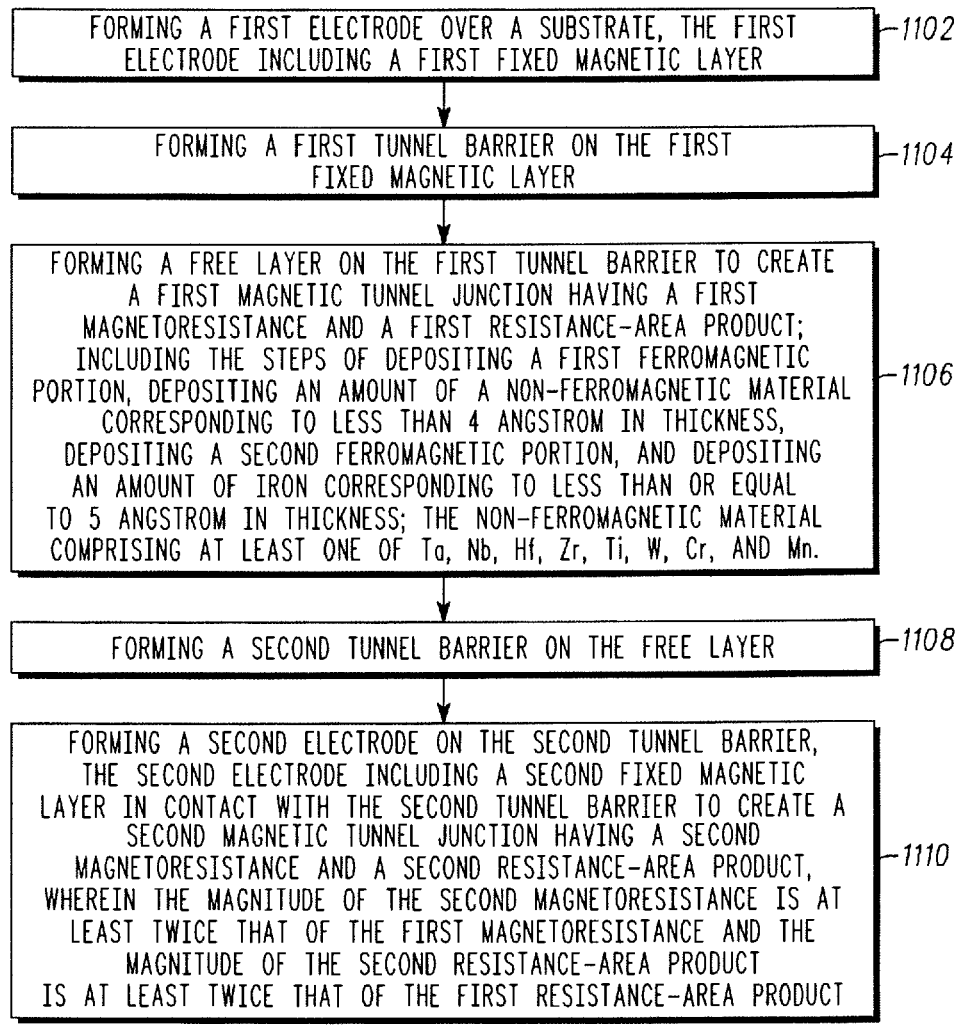
FIG. 11 is a flow chart in accordance with another exemplary embodiment of a process for fabricating a spin-torque magnetoresistive memory element.

Referring to FIG. 11, a method for forming a dual tunnel barrier structure including an insertion layer and an Fe deposition includes forming 1102 a first electrode over a substrate, the first electrode including a first fixed magnetic layer, forming 1104 a first tunnel barrier on the first fixed magnetic layer, forming 1106 a free layer on the first tunnel barrier to create a first magnetic tunnel junction having a first magnetoresistance and a first resistance-area product, wherein forming the free layer includes the steps of depositing a first ferromagnetic portion, depositing an amount of a non-ferromagnetic material corresponding to less than 4 angstroms in thickness, depositing a second ferromagnetic portion, and depositing an amount of iron corresponding to less than or equal to 5 Angstroms in thickness, the non-ferromagnetic material comprising at least one of Ta, Nb, Hf, Zr, Ti, W, Cr, and Mn. A second tunnel barrier is formed 1108 on the free layer, and a second electrode is formed 1110 on the second tunnel barrier, the second electrode including a second fixed magnetic layer in contact with the second tunnel barrier to create a second magnetic tunnel junction having a second magnetoresistance and a second resistance-area product, wherein the magnitude of the second magnetoresistance is at least twice that of the first magnetoresistance and the magnitude of the second resistance-area product is at least twice that of the first resistance-area product.

Figure 12:
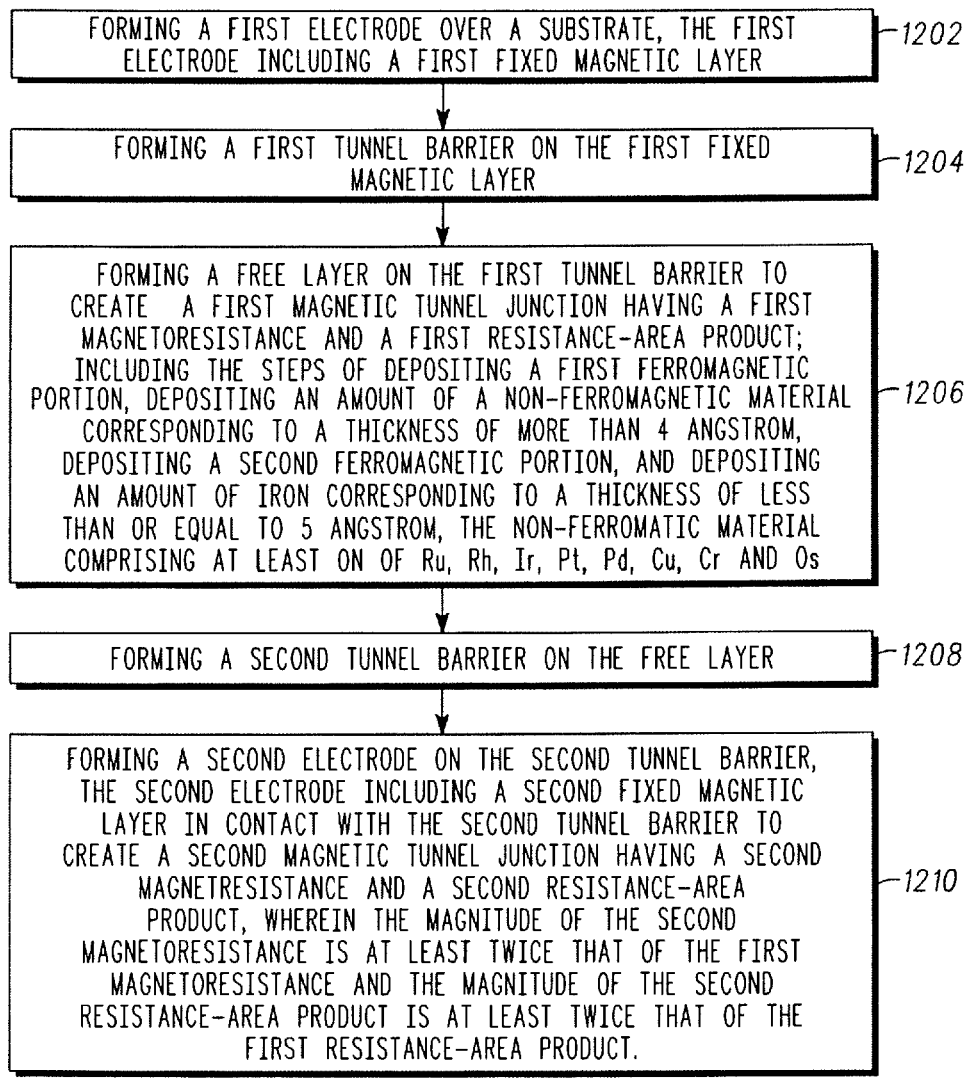
FIG. 12 is a flow chart in accordance with yet another exemplary embodiment of a process for fabricating a spin-torque magnetoresistive memory element.

Referring to FIG. 12, a method for forming a dual tunnel barrier structure including a coupling insertion layer and an Fe deposition includes forming 1202 a first electrode over a substrate, the first electrode including a first fixed magnetic layer, forming 1204 a first tunnel barrier on the first fixed magnetic layer, forming 1206 a free layer on the first tunnel barrier to create a first magnetic tunnel junction having a first magnetoresistance and a first resistance-area product, wherein forming the free layer includes the steps of depositing a first ferromagnetic portion, depositing an amount of a non-ferromagnetic coupling material corresponding to a thickness of between 2 Angstrom and 30 Angstrom, depositing a second ferromagnetic portion, and depositing an amount of iron corresponding to a thickness of less than or equal to 5 Angstroms, the non-ferromagnetic coupling material comprising at least one of Ru, Rb, Ir, Pt, Pd, Cu, Cr, and Os. A second tunnel barrier is formed 1208 on the free layer, and a second electrode is formed 1210 on the second tunnel barrier, the second electrode including a second fixed magnetic layer in contact with the second tunnel barrier to create a second magnetic tunnel junction having a second magnetoresistance and a second resistance-area product, wherein the magnitude of the second magnetoresistance is at least twice that of the first magnetoresistance and the magnitude of the second resistance-area product is at least twice that of the first resistance-area product.

Figure 13:
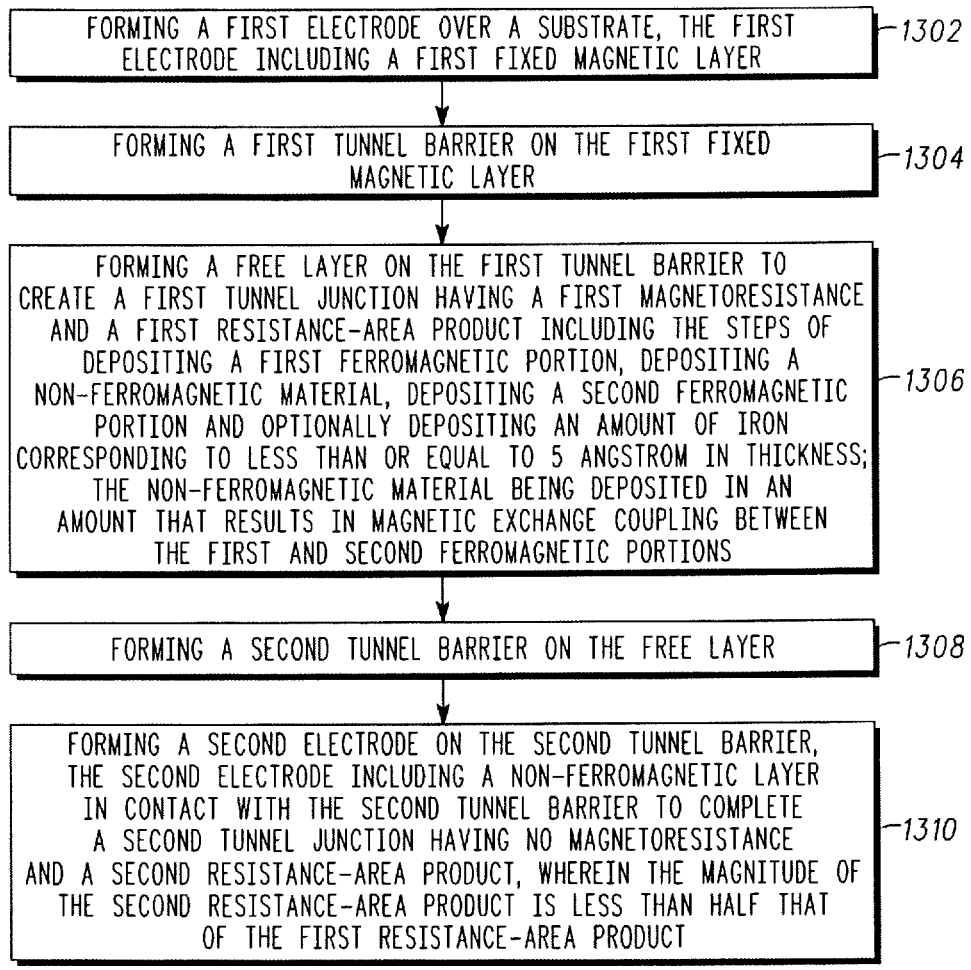
FIG. 13 is a flow chart in accordance with still another exemplary embodiment of a process for fabricating a spin-torque magnetoresistive memory element.

Referring to FIG. 13, a method for forming a double tunnel barrier structure including a non-ferromagnetic layer in contact with the second tunnel barrier and an optional Fe deposition includes forming 1302 a first electrode over a substrate, the first electrode including a first fixed magnetic layer, forming 1304 a first tunnel barrier on the first fixed magnetic layer, forming 1306 a free layer on the first tunnel barrier to create a first magnetic tunnel junction having a first magnetoresistance and a first resistance-area product, wherein forming the free layer includes the steps of depositing a first ferromagnetic portion, depositing an amount of a non-ferromagnetic material, depositing a second ferromagnetic portion, and optionally depositing an amount of iron corresponding to a thickness of less than or equal to 5 angstroms, the non-ferromagnetic material comprising an amount resulting in magnetic exchange coupling between the first and second ferromagnetic portions. A second tunnel barrier is formed 1308 on the free layer, and a second electrode is formed 1310 on the second tunnel barrier, the second electrode including a non-ferromagnetic layer in contact with the second tunnel barrier to create a second magnetic tunnel junction having no magnetoresistance and a second resistance-area product, wherein the magnitude of the second resistance-area product is less than half that of the first resistance-area product.

In summary, a magnetic element and fabricating method thereof is disclosed in which the MR is improved based on the inclusion of Fe at the high-magnetoresistance tunnel barrier, an Fe layer between the free layer and the top tunnel barrier, and a portion comprising a non-ferromagnetic transition metal within the free layer, such as an interlayer including Ta or an Ru coupling interlayer between first and second portions of the free layer.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A magnetoresistive memory element, comprising:
a first dielectric layer;
a second dielectric layer, wherein at least one of the first and second dielectric layers is a magnetic tunnel barrier; and
a free magnetic layer, disposed between the first and second dielectric layers, having a first surface in contact with the first dielectric layer and a second surface in contact with the second dielectric layer, wherein, between the first surface and the second surface, the free magnetic layer includes:
a first high-iron interface region located along the first surface of the free magnetic layer, wherein the first high-iron interface region has at least 50% iron by atomic composition, and
a first layer of ferromagnetic material adjacent to the first high-iron interface region, the first high-iron interface region between the first layer of ferromagnetic material and the first surface of the free magnetic layer.

2. The magnetoresistive memory element of claim 1, wherein the first high-iron interface region includes a continuous atomic layer of iron or a discontinuous atomic layer of iron.

3. The magnetoresistive memory element of claim 1, wherein the first high-iron interface region is or includes a high-iron alloy comprising iron and ferromagnetic material.

4. The magnetoresistive memory element of claim 1, wherein the first dielectric layer provides a first magnetic tunnel barrier and/or the second dielectric layer provides a second magnetic tunnel barrier.

5. The magnetoresistive memory element of claim 1, wherein the free magnetic layer includes perpendicular magnetic anisotropy.

6. The magnetoresistive memory element of claim 1, wherein the free magnetic layer further includes:
a second high-iron interface region located along the second surface of the free magnetic layer, wherein the second high-iron interface region has at least 50% iron by atomic composition.

7. The magnetoresistive memory element of claim 6, wherein the second high-iron interface region includes a continuous atomic layer of iron or a discontinuous atomic layer of iron.

8. The magnetoresistive memory element of claim 1, wherein the free magnetic layer further includes:
a second layer of ferromagnetic material over the first dielectric layer, and
an insertion layer located between and adjacent to the first layer of ferromagnetic material and the second layer of ferromagnetic material, wherein the insertion layer includes a non-ferromagnetic transition metal.

9. The magnetoresistive memory element of claim 7, wherein the non-ferromagnetic transition metal is tantalum, ruthenium, titanium, molybdenum, niobium, vanadium, zirconium, hafnium, chromium, manganese or tungsten.

10. The magnetoresistive memory element of claim 7, wherein the first insertion layer includes a continuous layer or a discontinuous layer.

11. A magnetoresistive memory element, comprising:
a first dielectric layer having a first magnetoresistance;
a second dielectric layer having a second magnetoresistance, wherein the second magnetoresistance is zero; and
a free magnetic layer, disposed between the first and second dielectric layers, having a first surface in contact with the first dielectric layer and a second surface in contact with the second dielectric layer, wherein, between the first surface and the second surface, the free magnetic layer includes:
a first high-iron interface region located along (i) the first surface of the free magnetic layer or (ii) the second surface of the free magnetic layer, wherein the first high-iron interface region has at least 50% iron by atomic composition, and
a first layer of ferromagnetic material adjacent to the first high-iron interface region.

12. The magnetoresistive memory element of claim 11, wherein the first high-iron interface region includes a continuous atomic layer of iron or discontinuous atomic layer of iron.

13. The magnetoresistive memory element of claim 11, wherein the first high-iron interface region is or includes a high-iron alloy comprising iron and ferromagnetic material.

14. The magnetoresistive memory element of claim 11, wherein:
the first high-iron interface region is located along the second surface of the free magnetic layer and the free magnetic layer includes perpendicular magnetic anisotropy at an interface between the free magnetic layer and the second dielectric layer.

15. The magnetoresistive memory element of claim 11, wherein:
the first high-iron interface region is located along the first surface of the free magnetic layer, and wherein the free magnetic layer further includes a second high-iron interface region located along the second surface of the free magnetic layer, wherein the second high-iron interface region has at least 50% iron by atomic composition.

16. A magnetoresistive memory element, comprising:
a first electrode including one or more ferromagnetic materials;
a second electrode including (i) one or more non-ferromagnetic materials and (ii) one or more ferromagnetic materials;
a first dielectric layer disposed between the first and the second electrodes, wherein the first dielectric layer is a magnetic tunnel barrier,
a second dielectric layer disposed between the first and the second electrodes, wherein the one or more non-ferromagnetic materials of the second electrode is/are is disposed on the second dielectric layer; and
a free magnetic layer, disposed between the first and second dielectric layers, having a first surface in contact with the first dielectric layer and a second surface in contact with the second dielectric layer, wherein, between the first surface and the second surface, the free magnetic layer includes:
a first high-iron interface region located along (i) the first surface of the free magnetic layer or (ii) the second surface of the free magnetic layer, wherein the first high-iron interface region has at least 50% iron by atomic composition, and
a first layer of ferromagnetic material adjacent to the first high-iron interface region.

17. The magnetoresistive memory element of claim 16, wherein the first high-iron interface region includes a continuous atomic layer of iron or a discontinuous atomic layer of iron.

18. The magnetoresistive memory element of claim 16, wherein the first high-iron interface region is or includes a high-iron alloy comprising iron and ferromagnetic material.

19. The magnetoresistive memory element of claim 16, wherein:
the first high-iron interface region is located along the second surface of the free magnetic layer and the free magnetic layer includes perpendicular magnetic anisotropy at an interface between the free magnetic layer and the second dielectric layer.

20. The magnetoresistive memory element of claim 16, wherein:
the first high-iron interface region is located along the first surface of the free magnetic layer, and wherein the free magnetic layer further includes a second high-iron interface region located along the second surface of the free magnetic layer, wherein the second high-iron interface region has at least 50% iron by atomic composition.

21. The magnetoresistive memory element of claim 20, wherein:
the free magnetic layer includes perpendicular magnetic anisotropy at an interface between the free magnetic layer and the first dielectric layer.

22. A method of manufacturing a magnetoresistive memory element on a substrate, comprising:
forming a first dielectric layer;
forming a second dielectric layer; and
forming a free magnetic layer between the first and second dielectric layers, wherein a first surface of the free magnetic layer is in contact with the first dielectric layer and a second surface of the free magnetic layer is in contact with the second dielectric layer, wherein forming the free magnetic layer includes:
depositing a first layer of ferromagnetic material over the first dielectric layer, and
forming a first high-iron interface region wherein the first high-iron interface region is located at (i) the first surface of the free magnetic layer or (ii) the second surface of the free magnetic layer, wherein the first high-iron interface region includes at least 50% iron by atomic composition and is in contact with the first layer of ferromagnetic material.

23. The method of manufacturing of claim 22, wherein forming the first high-iron interface region includes depositing iron to form a continuous atomic layer of iron or a discontinuous atomic layer of iron.

24. The method of manufacturing of claim 22, wherein forming a first high-iron interface region includes forming a high-iron alloy.

25. The method of manufacturing of claim 22, wherein forming the first high-iron interface region includes depositing iron having a thickness that is less than 5 Angstroms.

26. The method of manufacturing of claim 22, wherein forming the first high-iron interface region includes depositing pure iron having a thickness that is less than 5 Angstroms.

27. The method of manufacturing of claim 22, wherein:
the first high-iron interface region is located at the first surface of the free magnetic layer which is in contact with the first dielectric layer, and
the method of forming the free magnetic layer further includes forming a second high-iron interface region which is located at the second surface of the free magnetic layer, wherein the second high-iron interface region includes at least 50% iron by atomic composition.

28. The method of manufacturing of claim 27, wherein forming the second high-iron interface region includes depositing pure iron having a thickness that is less than 5 Angstroms.

29. The method of manufacturing of claim 22, further including:
forming a non-ferromagnetic region having a first surface of the non-ferromagnetic region in contact with (i) the first dielectric layer or (ii) the second dielectric layer, and
depositing a ferromagnetic material on a second surface of the non-ferromagnetic region.

30. The method of manufacturing of claim 29, wherein forming a non-ferromagnetic region includes depositing ruthenium.

31. The method of manufacturing of claim 30, wherein:
depositing ruthenium further includes depositing ruthenium on the second dielectric layer, and
depositing a ferromagnetic material on the second surface of the non-ferromagnetic region includes depositing cobalt and/or iron on the second surface of the non-ferromagnetic region.

32. The method of manufacturing of claim 22, wherein the first high-iron interface region is located at the second surface of the free magnetic layer and is in contact with a first surface of the second dielectric layer, the method further includes:
forming a non-ferromagnetic region having a surface which is in contact with a second surface of the second dielectric layer.

33. The method of manufacturing of claim 32, wherein forming the non-ferromagnetic region on the second dielectric layer includes:
depositing a non-ferromagnetic material on the second dielectric layer, and
depositing a ferromagnetic material on the non-ferromagnetic region.

34. The method of manufacturing of claim 32, wherein forming the non-ferromagnetic region on the second dielectric layer includes:
depositing a ferromagnetic material on the second dielectric layer, and
depositing a non-ferromagnetic material on the ferromagnetic region.

35. The method of manufacturing of claim 32, wherein forming a first high-iron interface region includes forming a high-iron alloy wherein the high-iron alloy includes at least 50% iron by atomic composition.

36. The method of manufacturing of claim 35, wherein forming the first high-iron interface region includes depositing less than or equal to 5 Angstroms of iron.

37. The method of manufacturing of claim 32, wherein forming the first high-iron interface region includes depositing between 1.5-3 Angstroms of iron.

38. The method of manufacturing of claim 32, wherein forming a free magnetic layer further includes:
depositing a second layer of ferromagnetic material over the first dielectric layer, and
depositing an insertion layer between and adjacent to the first layer of ferromagnetic material and the second layer of ferromagnetic material, wherein the insertion layer includes a non-ferromagnetic transition metal.

39. The method of manufacturing of claim 38, wherein the non-ferromagnetic transition metal is tantalum, ruthenium, titanium, molybdenum, niobium, vanadium, zirconium, hafnium, chromium, manganese or tungsten.

40. The method of manufacturing of claim 39, wherein forming the free magnetic layer further includes forming a second high-iron interface region located at the first surface of the free magnetic layer and in contact with a surface of the first dielectric layer, wherein the second high-iron interface region includes at least 50% iron by atomic composition.

41. The method of manufacturing of claim 22, wherein forming a free magnetic layer further includes:
   depositing a second layer of ferromagnetic material over the first dielectric layer, and
   depositing an insertion layer between and adjacent to the first layer of ferromagnetic material and the second layer of ferromagnetic material, wherein the insertion layer includes a non-ferromagnetic transition metal.

42. The method of manufacturing of claim 41, wherein the non-ferromagnetic transition metal is tantalum, ruthenium, titanium, molybdenum, niobium, vanadium, zirconium, hafnium, chromium, manganese or tungsten.

43. The method of manufacturing of claim 42, wherein the first high-iron interface region is located at the first surface of the free magnetic layer, and
   forming the free magnetic layer further includes forming a second high-iron interface region located at the second surface of the free magnetic layer, wherein the second high-iron interface region includes at least 50% iron by atomic composition.

* * * * *